US011848232B2

(12) United States Patent
Liu et al.

(10) Patent No.: US 11,848,232 B2
(45) Date of Patent: *Dec. 19, 2023

(54) METHOD FOR SI GAP FILL BY PECVD

(71) Applicant: Applied Materials, Inc., Santa Clara, CA (US)

(72) Inventors: Xin Liu, Fremont, CA (US); Fei Wang, Fremont, CA (US); Rui Cheng, Santa Clara, CA (US); Abhijit Basu Mallick, Fremont, CA (US); Robert Jan Visser, Menlo Park, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/839,170

(22) Filed: Jun. 13, 2022

(65) Prior Publication Data
US 2022/0310448 A1 Sep. 29, 2022

Related U.S. Application Data

(62) Division of application No. 16/975,794, filed as application No. PCT/US2019/021205 on Mar. 7, 2019, now Pat. No. 11,361,991.
(Continued)

(51) Int. Cl.
*H01L 21/768* (2006.01)
*C23C 16/01* (2006.01)
(Continued)

(52) U.S. Cl.
CPC ........ *H01L 21/76837* (2013.01); *C23C 16/01* (2013.01); *C23C 16/24* (2013.01);
(Continued)

(58) Field of Classification Search
CPC ......... H01L 21/76837; H01L 21/02164; H01L 21/02274; H01L 21/02532;
(Continued)

(56) References Cited

U.S. PATENT DOCUMENTS 4,569,701 A * 2/1986 Oh .................... H01L 21/76237
438/389
4,676,847 A * 6/1987 Lin ....................... H01L 29/945
438/564
(Continued)

FOREIGN PATENT DOCUMENTS

| JP | H06291063 A | 10/1994 |
| JP | H07297136 A | 11/1995 |

(Continued)

OTHER PUBLICATIONS

International Search Report and Written Opinion dated Jun. 17, 2019 for Application No. PCT/US2019/021205.
(Continued)

*Primary Examiner* — Monica D Harrison
*Assistant Examiner* — Andre C Stevenson
(74) *Attorney, Agent, or Firm* — Patterson + Sheridan, LLP

(57) ABSTRACT

Embodiments of the present disclosure relate to processes for filling trenches. The process includes depositing a first amorphous silicon layer on a surface of a layer and a second amorphous silicon layer in a portion of a trench formed in the layer, and portions of side walls of the trench are exposed. The first amorphous silicon layer is removed. The process further includes depositing a third amorphous silicon layer on the surface of the layer and a fourth amorphous silicon layer on the second amorphous silicon layer. The third amorphous silicon layer is removed. The deposition/removal cyclic processes may be repeated until the trench is
(Continued)

filled with amorphous silicon layers. The amorphous silicon layers form a seamless amorphous silicon gap fill in the trench since the amorphous silicon layers are formed from bottom up.

20 Claims, 3 Drawing Sheets

Related U.S. Application Data

(60) Provisional application No. 62/640,853, filed on Mar. 9, 2018.

(51) Int. Cl.
| | |
|---|---|
| *C23C 16/24* | (2006.01) |
| *C23C 16/455* | (2006.01) |
| *C23C 16/46* | (2006.01) |
| *C23C 16/56* | (2006.01) |
| *H01L 21/02* | (2006.01) |
| *H01L 21/3205* | (2006.01) |
| *H01L 29/06* | (2006.01) |

(52) U.S. Cl.
CPC ........ *C23C 16/45536* (2013.01); *C23C 16/46* (2013.01); *C23C 16/56* (2013.01); *H01L 21/02164* (2013.01); *H01L 21/02274* (2013.01); *H01L 21/02532* (2013.01); *H01L 21/32055* (2013.01); *H01L 29/0649* (2013.01)

(58) Field of Classification Search
CPC ........... H01L 21/32055; H01L 29/0649; C23C 16/01; C23C 16/24; C23C 16/45536; C23C 16/56; C23C 16/46
See application file for complete search history.

(56) References Cited

U.S. PATENT DOCUMENTS

| | | | | |
|---|---|---|---|---|
| 6,074,925 | A * | 6/2000 | Aisou | H01L 21/76843 |
| | | | | 438/653 |
| 8,940,388 | B2 * | 1/2015 | Antonov | H01L 21/02172 |
| | | | | 257/532 |
| 11,361,991 | B2 * | 6/2022 | Liu | C23C 16/01 |
| 2003/0162363 | A1 | 8/2003 | Ji | |
| 2004/0079632 | A1 | 4/2004 | Ahmad et al. | |
| 2014/0248754 | A1 | 9/2014 | Thadani et al. | |
| 2016/0013135 | A1* | 1/2016 | He | H01L 23/481 |
| | | | | 438/653 |
| 2016/0345084 | A1* | 11/2016 | Friza | H04R 19/005 |
| 2017/0114453 | A1 | 4/2017 | Chen et al. | |
| 2017/0271196 | A1 | 9/2017 | Manna et al. | |
| 2017/0372919 | A1 | 12/2017 | Manna et al. | |

FOREIGN PATENT DOCUMENTS

| | | |
|---|---|---|
| JP | 2013-239717 A | 11/2013 |
| JP | 2014-512669 A | 5/2014 |
| JP | 2016-150879 A | 8/2016 |
| JP | 2017-085165 A | 5/2017 |
| JP | 2018-022743 A | 2/2018 |
| KR | 10-2012-0099243 A | 9/2012 |
| WO | 2014107290 A1 | 7/2014 |

OTHER PUBLICATIONS

Japanese Office Action dated Feb. 14, 2023 for Application No. 2020-546333.

* cited by examiner

METHOD FOR SI GAP FILL BY PECVD

CROSS-REFERENCE TO RELATED APPLICATIONS

This application is a divisional of co-pending U.S. patent application Ser. No. 16/975,794, filed on Aug. 26, 2020, which is a National Stage entry and claims priority to International Application No. PCT/US2019/021205, filed Mar. 7, 2019, which claims priority to U.S. Provisional Patent Application Ser. No. 62/640,853, filed on Mar. 9, 2018 which herein is incorporated by reference.

BACKGROUND

Field

Embodiments of the present disclosure relate to methods of forming gap fill materials on a substrate.

Description of the Related Art

In semiconductor processing, devices are being manufactured with continually decreasing feature dimensions. Often, features utilized to manufacture devices at these advanced technology nodes include high aspect ratio structures and it is often necessary to fill gaps between the high aspect ratio structures with a gap fill material, such as an insulating material. Examples where insulating materials are utilized for gap fill applications include shallow trench isolation (STI), inter-metal dielectric layers (ILD), pre-metal dielectrics (PMD), passivation layers, patterning applications, etc. As device geometries shrink and thermal budgets are reduced, void-free filling of high aspect ratio spaces becomes increasingly difficult due to limitations of existing deposition processes.

Gap fill materials may be deposited by various deposition processes, for example flowable chemical vapor deposition (FCVD). The as-deposited gap fill materials by FCVD are usually of poor quality, characterized by high wet etch rate ratio (WERR) and high stress, and require subsequent processes, such as curing and/or annealing, to improve the quality of the gap fill materials.

Therefore, there is a need for improved processes for forming gap fill materials.

SUMMARY

Embodiments of the present disclosure relate to methods of forming gap fill materials on a substrate. In one embodiment, a method includes heating a substrate disposed in a process chamber to a temperature ranging from about 150 degrees Celsius to about 650 degrees Celsius, flowing a silane-containing precursor into the process chamber, depositing a first amorphous silicon layer on a bottom of a feature formed in the substrate and a second amorphous silicon layer on a surface of the substrate, a first portion of each sidewall of the feature is in contact with the first amorphous silicon layer and a second portion of each sidewall is exposed, and removing the second amorphous silicon layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

Figure 1A:
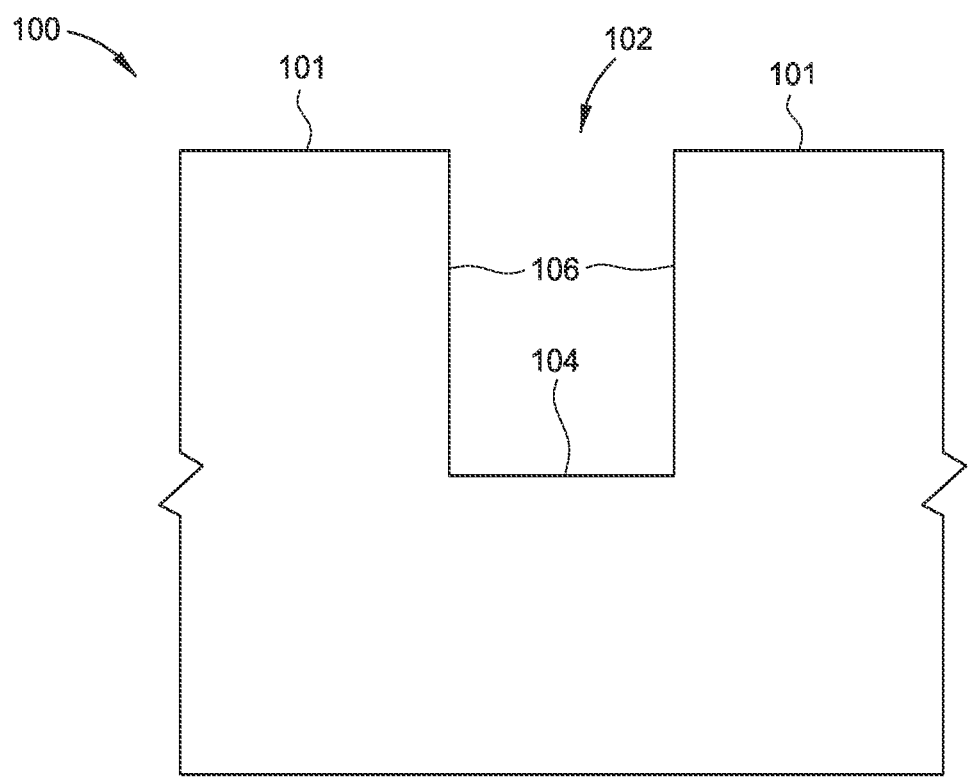
FIGS. 1A-1F schematically illustrate a process for forming gap fill materials on a substrate according to one embodiment described herein.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments of the present disclosure relate to processes for filling trenches. The process includes depositing a first amorphous silicon layer on a surface of a layer and a second amorphous silicon layer in a portion of a trench formed in the layer, and portions of side walls of the trench are exposed. The first amorphous silicon layer is removed. The process further includes depositing a third amorphous silicon layer on the surface of the layer and a fourth amorphous silicon layer on the second amorphous silicon layer. The third amorphous silicon layer is removed. The deposition/removal cyclic processes may be repeated until the trench is filled with amorphous silicon layers. The amorphous silicon layers form a seamless amorphous silicon gap fill in the trench since the amorphous silicon layers are formed from bottom up.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

FIGS. 1A-1F schematically illustrate a process for forming gap fill materials on a substrate according to one embodiment described herein. As shown in FIG. 1A, a substrate 100 includes a feature 102. The Figures show substrates having a single feature for illustrative purposes; however, those skilled in the art will understand that there can be more than one feature. The shape of the feature 102 can be any suitable shape including, but not limited to, trenches and cylindrical vias. As used in this regard, the term "feature" means any intentional surface irregularity. Suitable examples of features include, but are not limited to trenches and vias which have a bottom and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

Figure 1B:
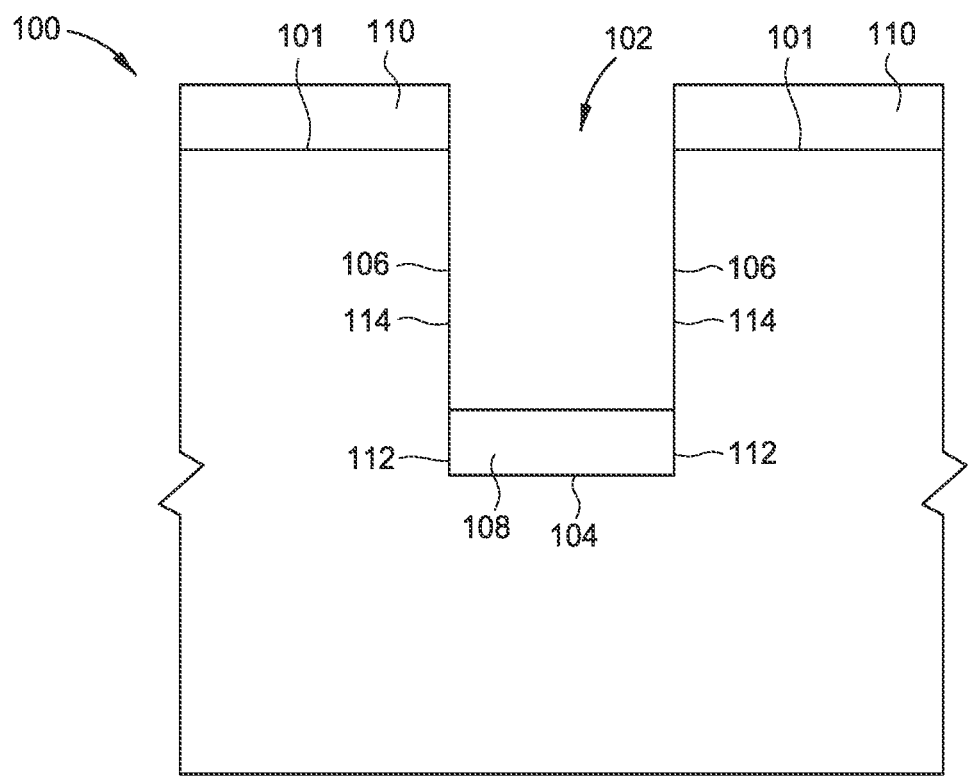

The substrate 100 includes a surface 101, and the feature 102 is an opening formed in the surface 101. In one embodiment, the substrate 100 includes a STI region that is fabricated from a dielectric material, such as silicon oxide or silicon nitride, and the feature 102 is formed in the STI region. The feature 102 includes a bottom 104 and sidewalls 106. Next, as shown in FIG. 1B, a first amorphous silicon layer 108 is deposited on the bottom 104 of the feature 102, and a second amorphous silicon layer 110 is deposited on the surface 101 of the substrate 100. The first amorphous silicon layer 108 and the second amorphous silicon layer 110 are deposited by a plasma enhanced chemical vapor deposition (PECVD) process.

In one embodiment, the PECVD process for depositing the first amorphous silicon layer 108 and the second amorphous silicon layer 110 includes flowing a silicon-containing precursor into a process chamber, and forming a plasma in the process chamber. In one embodiment, the process chamber is the Producer® XP Precision™ chamber, available from Applied Materials Inc. of Santa Clara, California. The plasma may be formed in-situ or in a remote location and then flowed into the process chamber. The silicon-containing precursor may be a silane-containing precursor, such as silane, disilane, trisilane, or tetrasilane. In one embodiment, the silicon-containing precursor is a lower order silane-containing precursor, such as silane or disilane. The plasma power density ranges from about 0.14 W/cm$^2$ to about 2.83 W/cm$^2$, and the processing temperature, i.e., the temperature of the substrate during processing, ranges from about 150 degrees Celsius to about 650 degrees Celsius, for example 200 degrees Celsius to about 550 degrees Celsius. It has been discovered that when a silane-containing precursor, such as a lower order silane-containing precursor, is used at the above mentioned processing conditions, the first amorphous silicon layer 108 and the second amorphous silicon layer 110 as deposited are not flowable. Because the first amorphous silicon layer 108 and the second amorphous silicon layer 110 are not flowable, material is not disposed on the sidewalls 106 during the deposition process, likelihood of bridging of sidewall material (and corresponding void formation) is reduced. The first amorphous silicon layer 108 and the second amorphous silicon layer 110 as deposited have improved quality compared to the flowable amorphous silicon layer. Furthermore, no subsequent curing and/or annealing processes are necessary.

Unlike conformal layer formed by atomic layer deposition (ALD) process, which mostly or completely covers sidewalls 106 during deposition, the first amorphous silicon layer 108 is formed on the bottom 104 of the feature 102 and in contact with a first portion 112 of each sidewall 106. A second portion 114 of each sidewall 106 is exposed and not covered by the first amorphous silicon layer 108. Similarly, the second amorphous silicon layer 110, which is formed simultaneously as the first amorphous silicon layer 108, is formed on the surface 101 and not on the second portion 114 of each sidewall 106 of the feature 102. The first amorphous silicon layer 108 and the second amorphous silicon layer 110 are formed on the bottom 104 and the surface 101, respectively, and the bottom 104 is substantially parallel to the surface 101. Thus, the first amorphous silicon layer 108 and the second amorphous silicon layer 110 form on substantially parallel surfaces and have generally the same thickness or approximately the same thicknesses. In other words, the first amorphous silicon layer 108 and the second amorphous silicon layer 110 form on horizontal surfaces, while not forming on vertical surfaces. The only portion of the sidewall 106 (vertical surface) that is covered is the portion that corresponds to the thickness of the first amorphous silicon layer 108 that is disposed on the bottom 104.

Figure 1C:
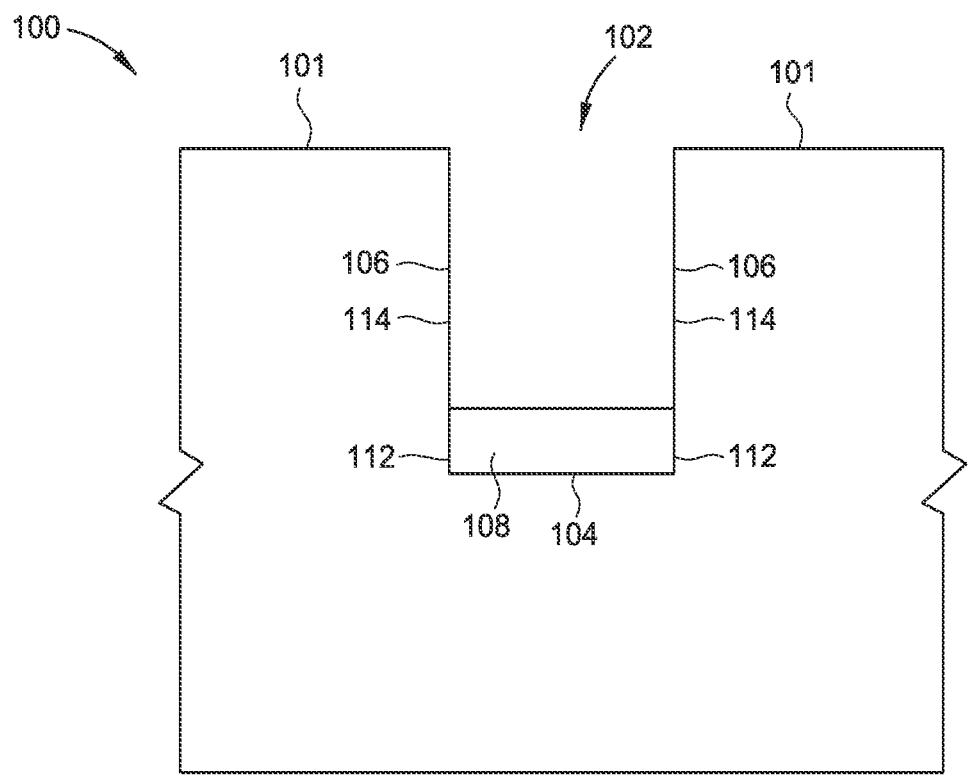

Next, as shown in FIG. 1C, the second amorphous silicon layer 110 is removed from the surface 101. The removal process may be a plasma etch process that is performed in the same process chamber as the process chamber in which the first and second amorphous silicon layers 108, 110 are formed. The chamber pressure of the plasma etch process may be the same as the chamber pressure during the PECVD process or different from the chamber pressure during the PECVD process. The processing temperature may be the same processing temperature as the PECVD process that deposits the first and second amorphous silicon layers 108, 110. Utilization of the same process temperature for the deposition and etch processes facilitates rapid transition between deposition and etch processes, which increases substrate throughput. The plasma power density ranges from about 0.14 W/cm$^2$ to about 2.83 W/cm$^2$. Under the above mentioned process conditions, the second amorphous silicon layer 110 is removed while the first amorphous silicon layer 108 is substantially unaffected because plasma ions losing energy due to collision to the sidewalls 106, radicals quenched/loss before reaching the bottom 104, and/or the plasma power density is controlled to minimize ion bombardment to the bottom 104. The etchant used for the removal process may be any suitable etchant. In one embodiment, the removal process is a physical plasma etch process, and the etchant used is helium. In another embodiment, the removal process is a chemical plasma etch process using a halogen containing etchant, such as a fluorine- or chlorine-containing etchant or hydrogen gas as the etchant, and the plasma is formed remotely. The halogen containing etchant and the hydrogen gas have a high selectivity of etching amorphous silicon over the material of the substrate 100, for example silicon oxide. In yet another embodiment, the removal process is a physical and chemical plasma etch process using a halogen containing etchant or hydrogen gas as the etchant, and the plasma is formed in-situ, such as a capacitively coupled plasma.

Figure 1D:
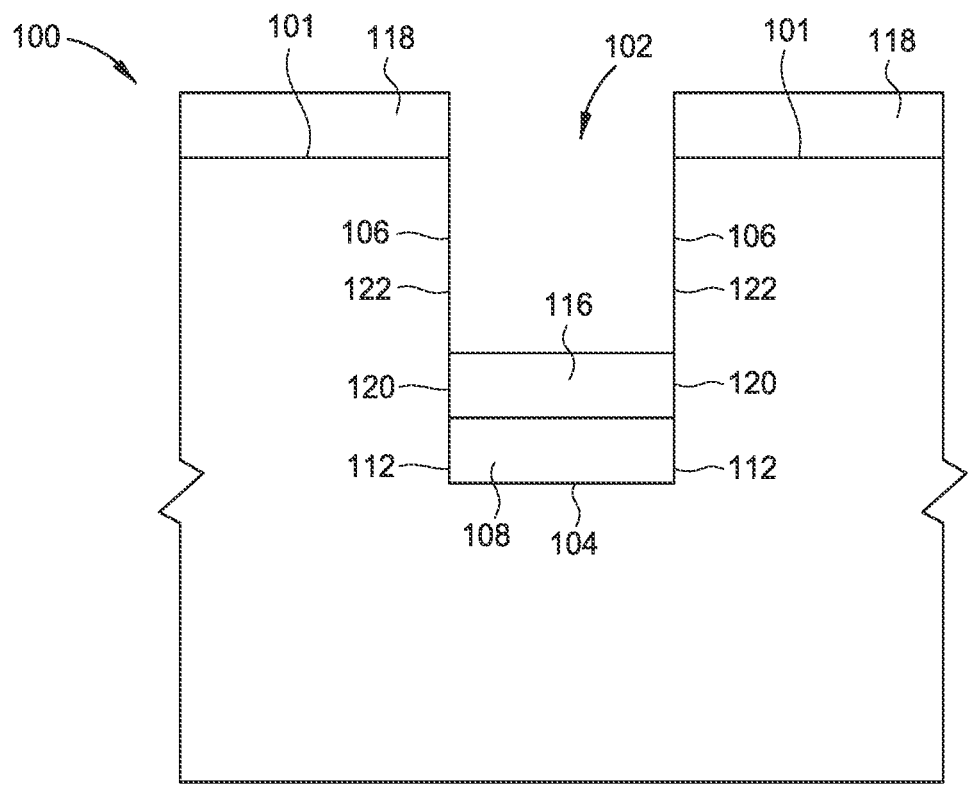

After removing the second amorphous silicon layer 110, a second PECVD process is performed to form a third amorphous silicon layer 116 on the first amorphous silicon layer 108 and a fourth amorphous silicon layer 118 on the surface 101, as shown in FIG. 1D. The second PECVD process may be performed under the same process conditions as the PECVD process for forming the first and second amorphous silicon layers 108, 110. The third amorphous silicon layer 116 is in contact with a portion 120 of each sidewall 106, and a portion 122 of each sidewall 106 is exposed. The third and fourth amorphous silicon layers 116, 118 have the same properties as the first and second amorphous silicon layers 108, 110, respectively.

Figure 1E:
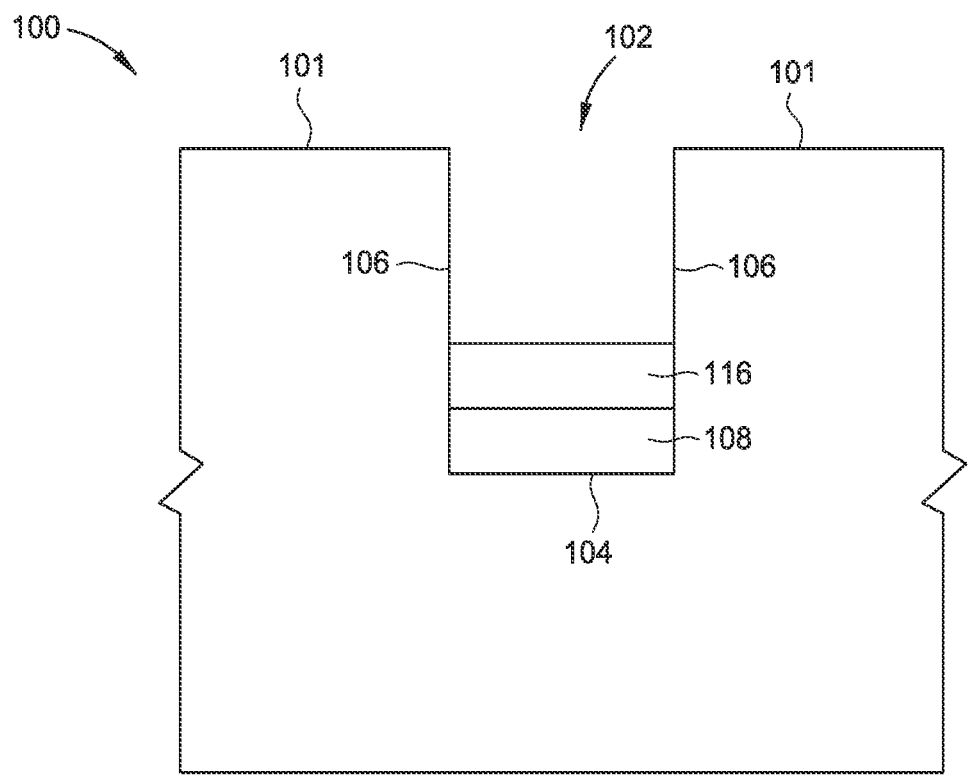
Figure 1F:
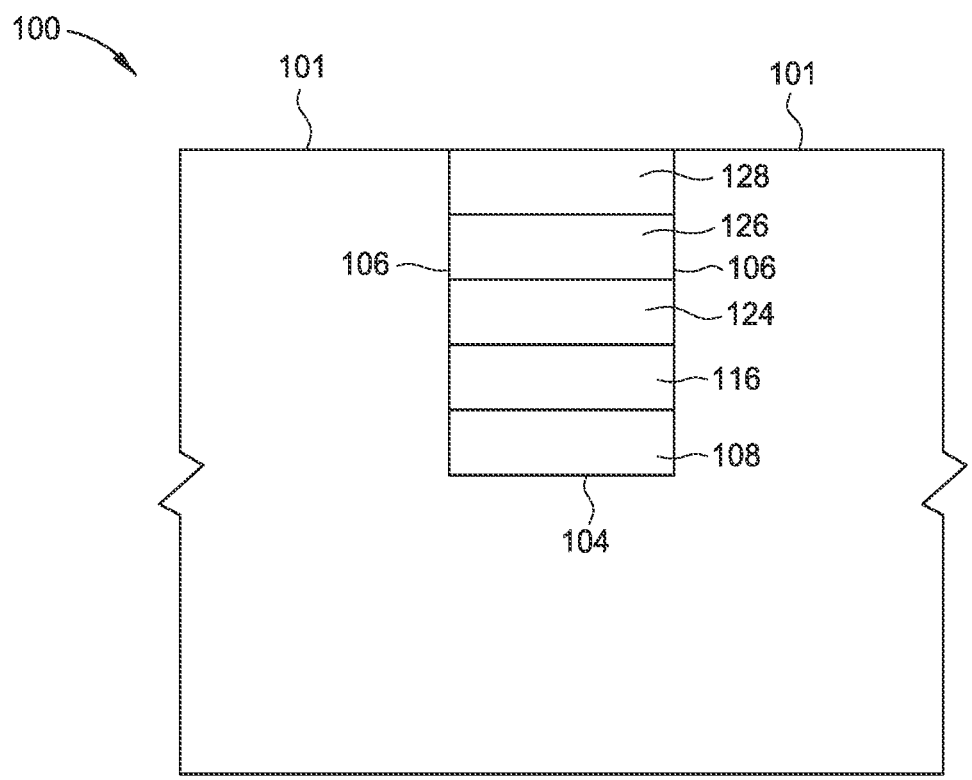

As shown in FIG. 1E, the fourth amorphous silicon layer 118 is removed from the surface 101. The removal process may be the same as the removal process for removing the second amorphous silicon layer 110. In one embodiment, the feature 102 is filled with the first amorphous silicon layer 108 and the third amorphous silicon layer 116. In other words, the entire bottom 104 is in contact with the first amorphous silicon layer 108 and the entire sidewalls 106 are in contact with the first amorphous silicon layer 108 and the third amorphous silicon layer 116. In other embodiments, additional deposition/removal cyclic processes may be performed to fill the feature 102. In one embodiment, as shown in FIG. 1F, additional amorphous silicon layers 124, 126, 128 are deposited on the third amorphous silicon layer 116, and no amorphous silicon layer is left remaining on the surface 101 as the result of the removal processes followed by following each deposition process. Because the plasma power for the removal process is low, ion bombardment into the feature 102 is minimized. Furthermore, the feature 102 is overfilled at the last deposition process of the deposition/removal cycles, and the last removal process removes the amorphous silicon layers on the surface 101 and over the feature 102. For each deposition/removal cycle (one cycle includes one deposition process and one removal process), the ratio of deposition time to the etch time may range from about 1 to 3 to about 1 to 15. In such an example, the etch time is substantially longer than the deposition time. The number of cycles depends on the depth of the feature 102 and/or the thickness of each amorphous silicon layer deposited in the feature 102. In one embodiment, the number of deposition/removal cycles ranges from about 50 to about 200, and the thickness of each amorphous silicon layer formed during a respective deposition cycle is between about 250 Angstroms to about 1000 Angstroms. The multiple amorphous silicon layers 108, 116, 124, 126, 128 formed in the feature 102 are formed from bottom up. Thus, there is no seam, or void, formed in the amorphous silicon layers 108, 116, 124, 126, 128.

By using deposition/removal cyclic processes, a feature, such as a trench, can be filled seamlessly from bottom up. Furthermore, because the amorphous silicon layers formed in the feature is not flowable, the quality of the amorphous silicon layers are improved over the conventional flowable amorphous silicon gap fill. Furthermore, subsequent curing and/or annealing processes typically performed after forming the flowable amorphous silicon gap fill are not necessary.

While the foregoing is directed to embodiments of the present disclosure, other and further embodiments of the disclosure may be devised without departing from the basic scope thereof, and the scope thereof is determined by the claims that follow.

The invention claimed is:

1. A method suitable for use in semiconductor manufacturing, comprising:
    heating a substrate disposed in a process chamber to a temperature ranging from about 200 degrees Celsius to about 550 degrees Celsius;
    flowing silane or disilane into the process chamber;
    forming a plasma in the process chamber; and
    depositing a first amorphous silicon layer on a bottom of a feature formed in the substrate, the feature having one or more sidewalls, the first amorphous silicon layer being in contact with a first portion of each sidewall of the feature and a second portion of each sidewall being exposed.

2. The method of claim 1, wherein a plasma power density ranges from about 0.14 W/cm2 to about 2.83 W/cm2.

3. The method of claim 1, wherein the first amorphous silicon layer is deposited to a thickness of about 250 Angstroms to about 1000 Angstroms.

4. The method of claim 1, wherein the first amorphous silicon layer is deposited by a plasma enhanced chemical vapor deposition process.

5. The method of claim 4, wherein a plasma power density of the plasma enhanced chemical vapor deposition process ranges from about 0.14 W/cm$^2$ to about 2.83 W/cm$^2$.

6. The method of claim 1, wherein the substrate includes a region formed of a dielectric material in which the feature is formed.

7. The method of claim 1, wherein a second amorphous silicon layer is deposited within the feature and on the first amorphous silicon layer.

8. A method suitable for use in semiconductor manufacturing, comprising:
    depositing a first amorphous silicon layer on a bottom of a feature formed in a substrate and a second amorphous silicon layer on a surface of the substrate, a first portion of each sidewall of the feature being in contact with the first amorphous silicon layer and a second portion of each sidewall being exposed, the depositing the first and second amorphous silicon layers comprising:
    heating the substrate disposed in a process chamber to a temperature ranging from about 150 degrees Celsius to about 650 degrees Celsius; and
    flowing a silane precursor into the process chamber;
    removing the second amorphous silicon layer; and
    repeating the depositing the first and second amorphous silicon layers and removing the second amorphous silicon layer until the feature is filled with amorphous silicon.

9. The method of claim 8, wherein the first amorphous silicon layer and the second amorphous silicon layer are deposited by a plasma enhanced chemical vapor deposition process, and wherein a plasma power density during the plasma enhanced chemical vapor deposition process is about 0.14 W/cm2 to about 2.83 W/cm2.

10. The method of claim 8, wherein the silane precursor is a silane or a disilane.

11. The method of claim 8, wherein the first amorphous silicon layer and the second amorphous silicon layer are formed simultaneously.

12. The method of claim 11, wherein the surface of the substrate is outside of the feature.

13. The method of claim 8, wherein the removing the second amorphous silicon layer comprises an etch process.

14. The method of claim 13, wherein a ratio of a deposition time during the depositing the first amorphous silicon layer and the second amorphous silicon layer to an etch time during the etch process is about 1:3 to about 1:15.

15. A method suitable for use in semiconductor manufacturing, comprising:
    heating a substrate disposed in a process chamber to a temperature ranging from about 150 degrees Celsius to about 650 degrees Celsius;
    flowing a silane precursor into the process chamber;
    forming a plasma in the process chamber; and
    depositing a first amorphous silicon layer on a bottom of a feature formed in the substrate, the feature having one or more sidewalls, the first amorphous silicon layer being in contact with a first portion of each sidewall of the feature and a second portion of each sidewall being exposed.

16. The method of claim 15, wherein the silane precursor is a silane or a disilane.

17. The method of claim 15, wherein the temperature is about 200 degrees Celsius to about 550 degrees Celsius.

18. The method of claim 15, further comprising etching the substrate.

19. The method of claim 18, wherein etching the substrate is performed at about 150 degrees Celsius to about 650 degrees Celsius.

20. The method of claim 19, wherein the etching is a plasma etch process and has a plasma power density of about 0.14 W/cm$^2$ to about 2.83 W/cm$^2$.

* * * * *